United States Patent
Park

(10) Patent No.: US 9,741,426 B2
(45) Date of Patent: Aug. 22, 2017

(54) SEMICONDUCTOR MEMORY DEVICE

(71) Applicant: SK hynix Inc., Gyeonggi-do (KR)

(72) Inventor: Nak-Kyu Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/171,623

(22) Filed: Jun. 2, 2016

(65) Prior Publication Data

US 2017/0186477 A1    Jun. 29, 2017

(30) Foreign Application Priority Data

Dec. 23, 2015 (KR) .................. 10-2015-0185077

(51) Int. Cl.
G11C 7/00 (2006.01)
G11C 11/4091 (2006.01)
G11C 11/4094 (2006.01)
G11C 11/408 (2006.01)

(52) U.S. Cl.
CPC ...... *G11C 11/4091* (2013.01); *G11C 11/4085* (2013.01); *G11C 11/4087* (2013.01); *G11C 11/4094* (2013.01)

(58) Field of Classification Search
CPC ............ G11C 8/12; G11C 7/18; G11C 7/1006
USPC .................. 365/206, 207, 230.03, 203
See application file for complete search history.

(56) References Cited

U.S. PATENT DOCUMENTS

| 2005/0195669 A1* | 9/2005 | Sim ................... G11C 7/12 365/203 |
| 2009/0109772 A1* | 4/2009 | Terzioglu ............ G11C 7/18 365/194 |
| 2011/0026348 A1* | 2/2011 | Narui ................. G11C 7/227 365/210.1 |

FOREIGN PATENT DOCUMENTS

KR    1020080014370    2/2008

* cited by examiner

*Primary Examiner* — Son Dinh
(74) *Attorney, Agent, or Firm* — IP & T Group LLP

(57) ABSTRACT

A semiconductor memory device may include: a plurality of memory mats; and a plurality of sense amplifier arrays arranged alternately with the memory mats, each sense amplifier array being suitable for sensing and amplifying data of memory mats adjacent thereto, wherein during a data sensing operation to a memory mat among the plurality of memory mats, in addition to a sense amplifier for the memory mat and sense amplifiers positioned immediately above and below the sense amplifier for the memory mat, at least one additional sense amplifier closest to the sense amplifier for the memory mat is also activated for providing additional amplification.

17 Claims, 8 Drawing Sheets

US 9,741,426 B2

SEMICONDUCTOR MEMORY DEVICE

CROSS-REFERENCE TO RELATED APPLICATIONS

The present application claims priority of Korean Patent Application No. 10-2015-0185077, filed on Dec. 23, 2015, which is incorporated herein by reference in its entirety.

BACKGROUND

1. Field

Exemplary embodiments of the present invention relate to a semiconductor design technology and, more particularly, to a semiconductor memory device including a sense amplifier.

2. Description of the Related Art

In general, semiconductor memory devices including the double data rate synchronous DRAM (DDR SDRAM) have a large number of memory cells therein. With the rapid increase in integration density of semiconductor memory devices, the number of memory cells included in semiconductor memory devices has also increased. The memory cells in a memory device are arranged regularly in one or more memory cell arrays, which are also commonly referred to as memory cell mats.

The memory cell structure of a semiconductor memory device may be roughly divided into a folded bit line architecture and an open bit line architecture.

The open bit line architecture includes a driving bit line for driving data and a reference bit line, which are arranged in different memory cell mats, with reference to a bit line sense amplifier arranged in a core region of the semiconductor memory device. Noise generated from the driving bit line is different from noise generated from the reference bit line, and do not offset each other. Thus the open bit line architecture is subject to bit line generated noise.

In the folded bit line architecture, a unit memory cell is designed to have an 8F2 structure, whereas in the open bit line architecture, a unit memory cell is designed to have a 6F2 structure. The unit memory cell structure determines the size of a semiconductor memory device. For the same data storage capacity, a semiconductor memory device having the open bit line architecture may be designed to have a smaller size than a semiconductor memory device having the folded bit line architecture.

FIG. 1 is a circuit diagram of a semiconductor memory device with a general open bit line architecture.

Referring to FIG. 1, each of first and second memory cell mats 210 and 220 in the semiconductor memory device with the open bit line architecture includes a plurality of memory cells for storing data. Each of first and second memory cell mats 210 and 220 may include a plurality of memory cell mats stacked on top of each other in a three dimensional configuration (not shown). The first memory cell mat 210 includes a first bit line BLT1 arranged therein, and the second memory cell mat 220 includes a first bit line bar BLB1 arranged therein.

A sense amplifier unit 230 serves to sense and amplify the voltages of the first bit line and bit line bar BLT1 and BLB1. The sense amplifier unit 230 senses and amplifies the voltages of the first bit line and bit line bar BLT1 and BLB1 according to first and second bit line isolation signals BISH and BISL. The sense amplifier unit 230 includes transistors which are turned on in response to the first and second bit line isolation signals BISH and BISL, and a latch-type sense amplifier circuit configured to perform a sense amplification operation. The sense amplifier circuit of the sense amplifier unit 230 senses the data transmitted through the first bit line and bit line bar BLT1 and BLB1, and amplifies the data to a voltage corresponding to a pull-up supply voltage RTO or pull-down supply voltage SB which is applied as power to the sense amplifier circuit all of which are well known in the art and thus are not illustrated in detail herein.

As described above, the open bit line architecture includes the driving bit line and the reference bit line arranged in different memory cell mats. For example, when data are driven to the first bit line BLT1, the first bit line bar BLB1 arranged in the second memory cell mat 220 becomes the reference bit line, and when data are driven to the first bit line bar BLB1, the first bit line BLT1 arranged in the first memory cell mat 210 becomes the reference bit line.

Thus, the open bit line architecture does not require separate transistors for separately operating the sense amplifier unit 230 for the first memory cell mat 210 and the second memory cell mat 220, respectively, and the sense amplifier unit 230 has only to sense and amplify the voltages of the first bit line BLT1 and the first bit line bar BLB1 according to the activated word line WL.

FIG. 2 is a block diagram of a conventional semiconductor memory device.

Referring to FIG. 2, the semiconductor memory device includes a command and address receiver 310, a bank address and command decoder 320, an address register 330, a row address decoder 340, a mat selection unit 350, a row decoder and mat controller 360, a word line decoder 370, and a DRAM core 380, which are well-known to those skilled in the art.

The DRAM core 380 includes a plurality of DRAM array units each having DRAM memory cells and bit line sense amplifiers BLSA for amplifying data stored in the cells. The DRAM core 380 has the general open bit line architecture as described with reference to FIG. 1.

The row decoder 360 and a column decoder (not illustrated) locate a memory cell to be accessed in response to a command and address applied from a device external to the memory device. The command for a DRAM operation includes a row address and column address, for example, a Row Address Strobe (RAS) signal, a column address strobe (CAS) signal, and a write enable (WE) signal.

The row decoder and mat controller 360 decode a row address RA<0:n> of the corresponding mat in response to the row address RA<0:n> which is generated by the row address decoder 340 as the RAS signal is enabled, a bank active signal ACT_BK<i> which is generated by the bank address and command decoder 320, and a mat select signal MATSEL<0:k> which is generated by the mat selection unit 350.

The word line decoder 370 generates a main word line select signal MWLB and a sub word line select signal FXB in response to the mat select signal MATSEL<0:k> and the decoded row address generated by the row address and mat controller 360.

When a word line WLB<i> in any one mat is activated during a read operation, enable signals SAEN<i> and SAEN<i+1> for the bit line sense amplifiers arranged at the top and bottom of the corresponding word line WLB<i> is enabled for sensing and amplifying data of a bit line which is coupled to a memory cell coupled to the word line WLB<i>.

FIG. 3 is a circuit diagram illustrating a part of the DRAM core 380 illustrated in FIG. 2.

Referring to FIGS. 2 and 3, the DRAM core includes a plurality of mats 410A to 410C, a plurality of sense amplifier arrays 420A to 420D, and sub word line drivers SWL DRV arranged at the left and right sides of each of the mats 410A to 410C.

Each of the sense amplifier arrays 420A to 420D senses and amplifies a bit line and a bit line bar (not illustrated) which are arranged in different mats. With reference to each of the sense amplifier arrays 420A to 420C, a bit line arranged in the upper mat is defined as an upper bit line BLU, and a bit line arranged in the lower mat is defined as a lower bit line BLD. When one word line of any one mat among the plurality of mats 410A to 410C is activated, all memory cells (not illustrated) coupled to the activated word line are opened. Then, bit lines BLU/BLD coupled to the memory cells share data, and all sense amplifiers within the sense amplifier arrays arranged at the top and bottom of the corresponding mat are enabled to perform a sense amplifying operation.

For example, when a word line WLB<i> of the second mat 410B is activated, the second and third sense amplifier arrays 420B and 420C arranged adjacent to the second mat 410B be activated to sense and amplify data of the corresponding bit lines. The second sense amplifier array 420B is activated in response to an (i+1)th sense amplifier enable signal, and the third sense amplifier array 420C is activated in response to an i-th sense amplifier enable signal.

Hereafter, a data sensing operation to the DRAM core 380 will be described with reference to FIG. 4. FIG. 4 is a timing diagram illustrating a data sensing operation to the DRAM core 380 of FIG. 3. Hereafter, referring to FIGS. 3 and 4, a sensing operation in case where a word line WLB<i> of the second mat 410B is activated will be described.

In the following descriptions, one sense amplifier included in each of the second and third sense amplifier arrays is taken as a representative example. With reference to the first sense amplifier 420B_1 of the second sense amplifier array 420B, a bit line arranged in the upper mat, for example, the first mat 410A is defined as the upper bit line BLU, and a bit line arranged in the lower mat, for example, the second mat 410B is defined as the lower bit line BLD.

The upper bit line BLU is amplified to a low level L while retaining a precharge voltage VBLP, and the lower bit line BLD shares high-level data information stored in a memory cell (not illustrated) with the upper bit line BLU as the word line WLB<i> is activated to the low level L. Then, the lower bit line BLB is sensed and amplified to the precharge voltage VBLP by the first sense amplifier 420B_1 of the second sense amplifier array 420B, and then amplified to the high level H while retaining the precharge voltage VBLP.

Furthermore, with reference to the first sense amplifier 420C_1 of the third sense amplifier array 420C, a bit line arranged in the upper mat, for example, the second mat 410B is defined as the upper bit line BLU, and a bit line arranged in the lower mat, for example, the third mat 410C is defined as the lower bit line BLD.

The upper bit line BLU shares high-level data information stored in a memory cell (not illustrated) with the lower bit line BLD, as the word line WLB<i> is activated to the low level L. Then, the upper bit line BLU is sensed and amplified to the precharge voltage VBLP by the first sense amplifier 420B_1 of the second sense amplifier array 420B, and then amplified to the high level H while retaining the precharge voltage VBLP. The lower bit line BLD is amplified to the low level L while retaining the precharge voltage VBLP.

Since the conventional semiconductor memory device with the open bit line architecture is configured in such a manner that one bit line is driven by one sense amplifier, the conventional semiconductor memory device cannot change the develop speed at which noise is caused.

SUMMARY

Various embodiments are directed to a semiconductor memory device with an improved sensing margin during a data sensing operation.

In an embodiment, a semiconductor memory device may include: a plurality of memory mats; and a plurality of sense amplifier arrays arranged alternately with the memory mats, each sense amplifier array being suitable for sensing and amplifying data of memory mats adjacent thereto, wherein during a data sensing operation to a memory mat among the plurality of memory mats, in addition to a sense amplifier for the memory mat and sense amplifiers positioned immediately above and below the sense amplifier for the memory mat, at least one additional sense amplifier closest to the sense amplifier for the memory mat is also activated for providing additional amplification.

Each of the memory mats may be a memory block.

The sensing operation may be to a Kth memory block among the plurality of memory blocks, and a Kth sense amplifier array, a (K+1)th sense amplifier array, a (K−1)th sense amplifier array, and a (K+2)th sense amplifier array are activated.

The semiconductor memory device may further include: a first switching unit suitable for electrically coupling a bit line of a (K+1)th memory block to a bit line of the Kth memory block during the data sensing operation to the Kth memory block; and a second switching unit suitable for electrically coupling a bit line of a (K−1)th memory block to the bit line of the Kth memory block during the data sensing operation to the Kth memory block.

The first switching unit may include: a plurality of bit line coupling transistors suitable for electrically coupling the (K+2)th sense amplifier array to the bit line of the (K+1)th memory block during a data sensing operation to the (K+1)th memory block; and a plurality of equalizing transistors suitable for equalizing the bit line during a precharge operation to the (K+1)th memory block, and wherein the plurality of equalizing transistors are turned on to electrically couple the bit line of the (K+1)th memory block to the bit line of the Kth memory block during the data sensing operation to the Kth memory block.

The plurality of bit line coupling transistors may be turned off during the data sensing operation to the Kth memory block.

The second switching unit may include: a plurality of bit line coupling transistors suitable for electrically coupling the (K−1)th sense amplifier array to the bit line of the (K−1)th memory block during a data sensing operation to the (K−1)th memory block; and a plurality of equalizing transistors suitable for equalizing the bit line during a precharge operation to the (K−1)th memory block, and wherein the plurality of equalizing transistors are turned on to electrically couple the bit line of the (K−1)th memory block to the bit line of the Kth memory block, during the data sensing operation to the Kth memory block.

The plurality of bit line coupling transistors may be turned off during the data sensing operation to the Kth memory block.

During the data sensing operation to the Kth memory block, the (K+2) sense amplifier array and the (K−1)th sense amplifier array may be activated at a predetermined time after the (K+1)th sense amplifier array and the Kth sense amplifier array are activated.

The semiconductor memory device may further include: a third switching unit suitable for electrically coupling the bit line of the (K+1)th memory block to the (K+1)th sense amplifier array during the data sensing operation to the Kth memory block; a fourth switching unit suitable for electrically coupling the bit line of the Kth memory block to the (K+1)th sense amplifier array during the data sensing operation to the Kth memory block; a fifth switching unit suitable for electrically coupling the bit line of the Kth memory block to the (K−1)th sense amplifier array during the data sensing operation to the Kth memory block; and a sixth switching unit suitable for electrically coupling the bit line of the (K−1)th memory block to the (K−1)th sense amplifier array during the data sensing operation to the Kth memory block.

Each of the third to sixth switching units may include: a plurality of bit line coupling transistors suitable for electrically coupling a bit line arranged in a memory block adjacent to the switching unit to a sense amplifier array adjacent to the switching unit during a data sensing operation to the memory block adjacent to the switching unit; and a plurality of equalizing transistors suitable for equalizing the bit line arranged in the memory block adjacent to the switching unit during a precharge operation to the memory block adjacent to the switching unit.

In an embodiment, a semiconductor memory device may include: first to third memory blocks; a first sense amplifier coupled to a first bit line of the first memory block; a second sense amplifier coupled to a second bit line of the first memory block and a third bit line of the second memory block; a third sense amplifier coupled to a fourth bit line of the second memory block and a fifth bit line of the third memory block; and a fourth sense amplifier coupled to a sixth bit line of the third memory block, wherein, during a data sensing operation to the second memory block, the first and fourth sense amplifiers are activated at a predetermined time after the second and third sense amplifiers are activated.

The semiconductor memory device may further include: a first switching unit suitable for electrically coupling the second bit line to the first sense amplifier during the data sensing operation to the second memory block; and a second switching unit suitable for electrically coupling the fifth bit line to the fourth sense amplifier during the data sensing operation to the second memory block.

The first switching unit may include: a plurality of bit line coupling transistors suitable for electrically coupling the first sense amplifier to the first bit line during a data sensing operation to the first memory block; and a plurality of equalizing transistors suitable for equalizing the first bit line during a precharge operation to the first memory block, and wherein the plurality of equalizing transistors are turned on to electrically couple the first bit line to the second bit line during the data sensing operation to the second memory block.

The plurality of bit line coupling transistors may be turned off during the data sensing operation to the second memory block.

The second switching unit may include: a plurality of bit line coupling transistors suitable for electrically coupling the fourth sense amplifier to the sixth bit line during a data sensing operation to the third memory block; and a plurality of equalizing transistors suitable for equalizing the sixth bit line during a precharge operation to the third memory block, and wherein the plurality of equalizing transistors are turned on to electrically couple the fifth bit line to the sixth bit line during the data sensing operation to the second memory block.

The plurality of bit line coupling transistors may be turned off during the data sensing operation to the second memory block.

DETAILED DESCRIPTION

Figure 1:
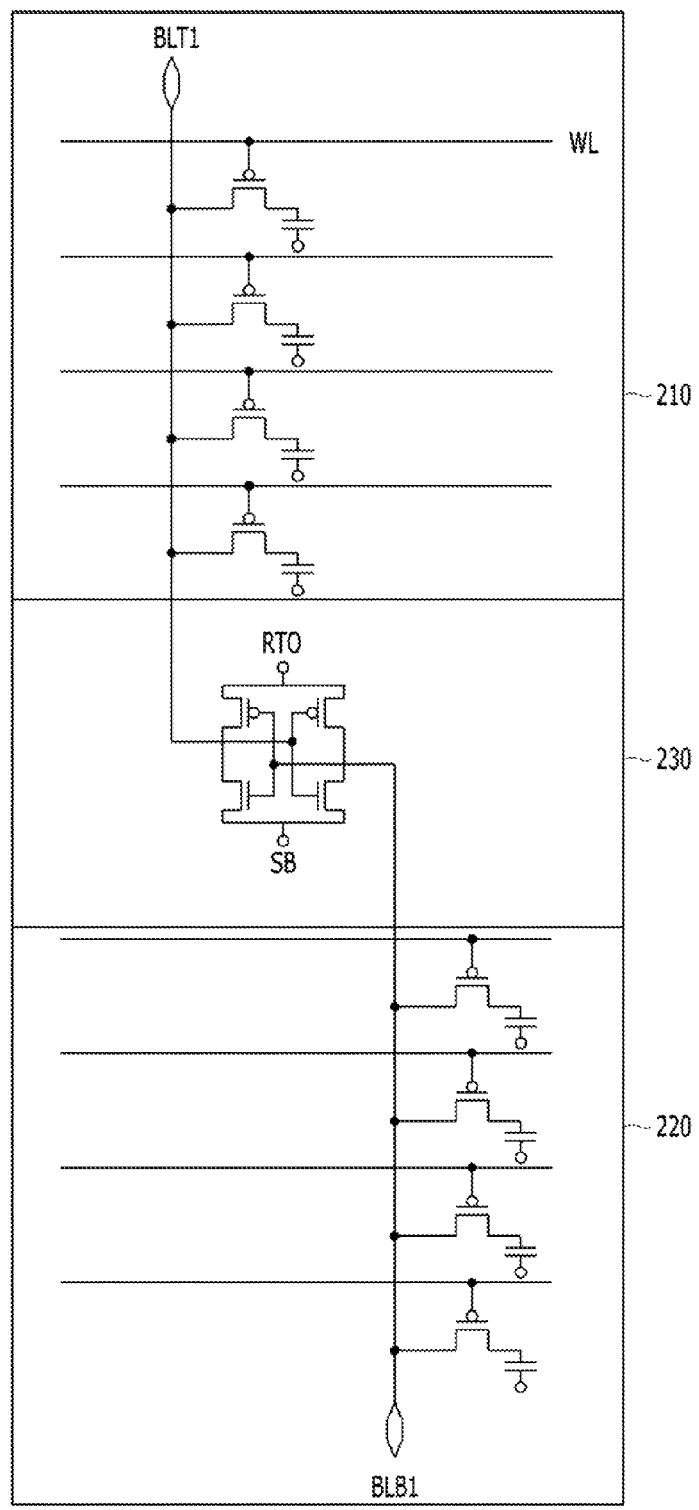
FIG. 1 is a circuit diagram of a semiconductor memory device with a general open bit line architecture.
Figure 2:
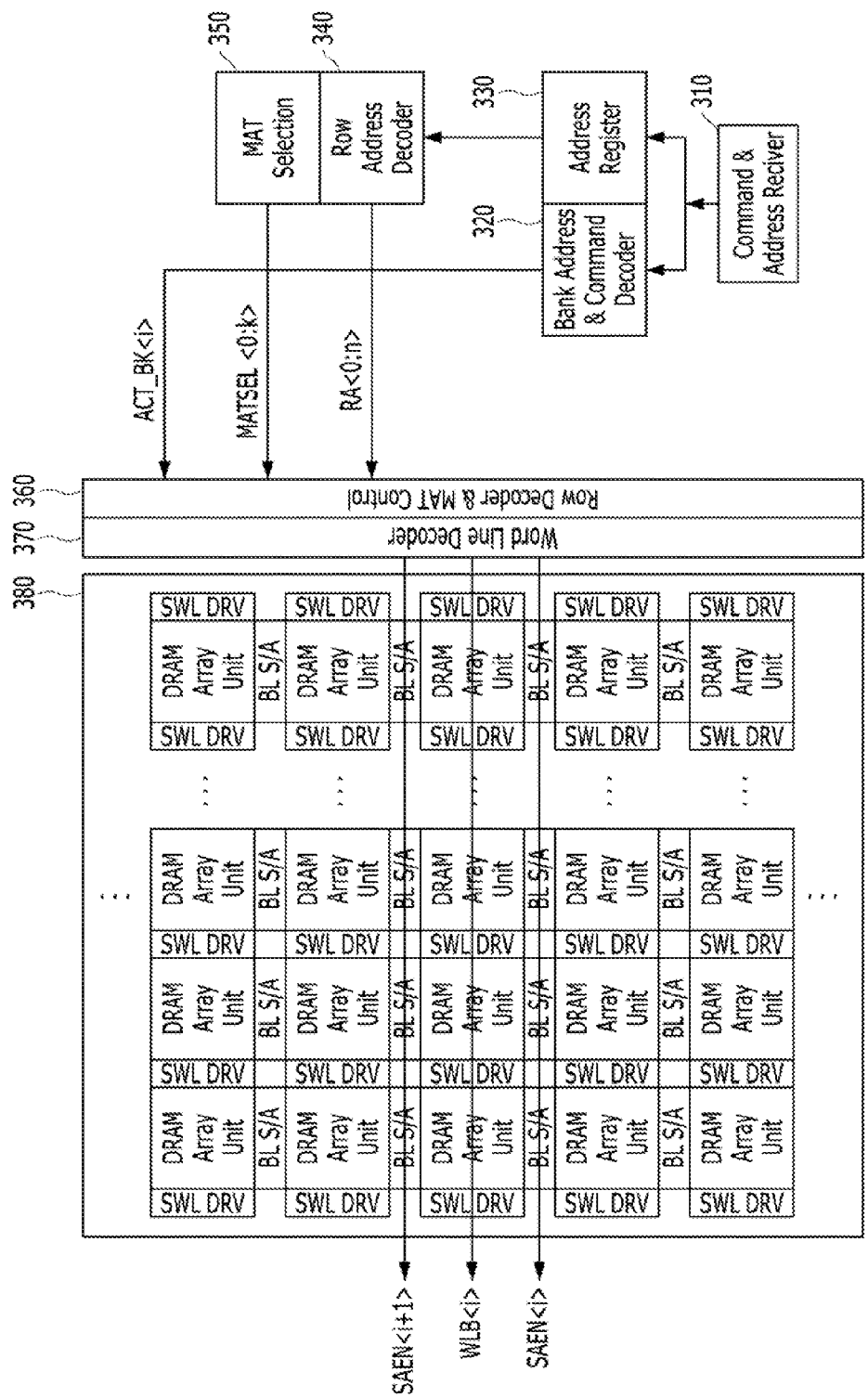
FIG. 2 is a block diagram of a conventional semiconductor memory device.
Figure 3:
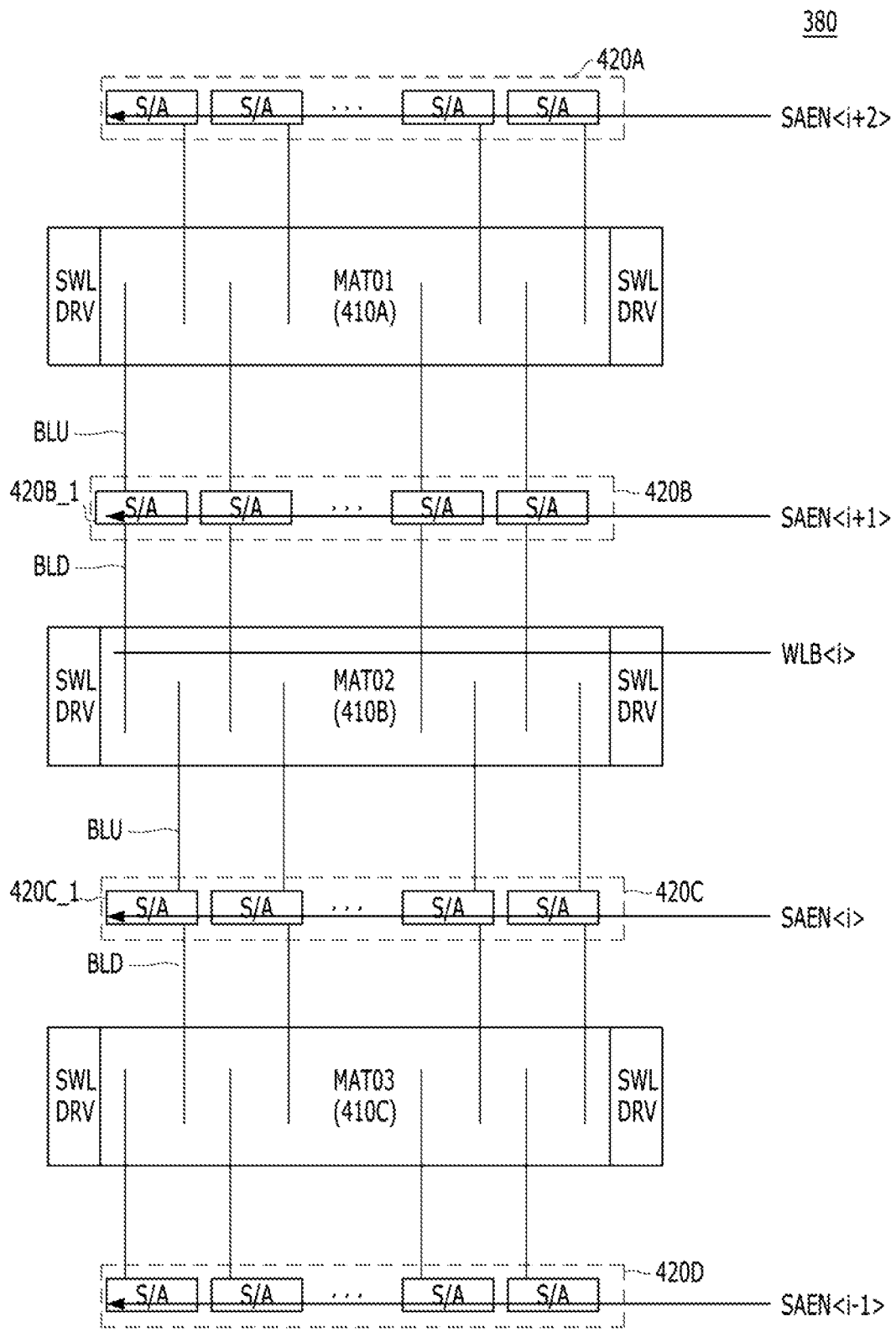
FIG. 3 is a circuit diagram illustrating a part of a DRAM core of FIG. 2.
Figure 4:
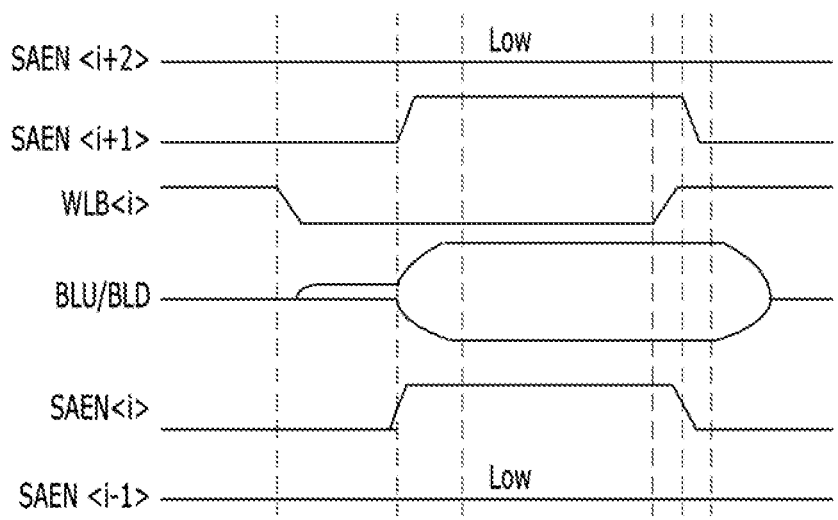
FIG. 4 is a timing diagram illustrating a data sensing operation to the DRAM core of FIG. 3.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In some instances, as would be apparent to one of ordinary skill in the art elements described in connection with a particular embodiment may be used singly or in combination with other embodiments unless otherwise specifically indicated.

Hereinafter, the various embodiments of the present invention will be described in detail with reference to the attached drawings.

Figure 5:
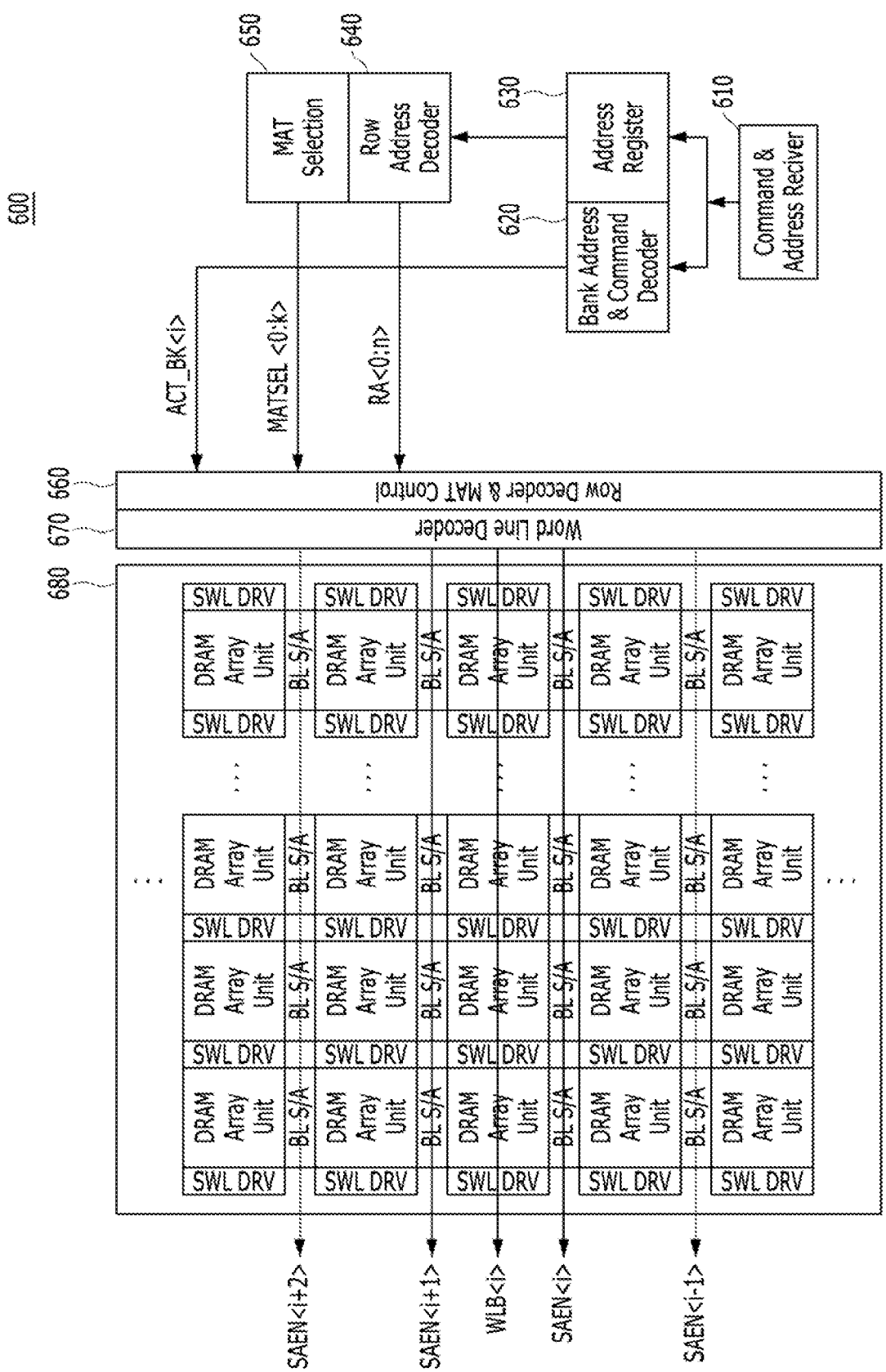
FIG. 5 is a block diagram of a semiconductor memory device, according to an embodiment of the present invention.

Referring now to FIG. 5 a semiconductor memory device is provided, according to an embodiment of the present invention.

The semiconductor memory device is generally designated with numeral 600 and may include a command and address receiver 610, a bank address and command decoder 620, an address register 630, a row address decoder 640, a mat selection unit 650, a row decoder and mat controller 660, a word line decoder 670, and a DRAM core 680, which are well-known to those skilled in the art.

The DRAM core 680 may include a plurality of DRAM array units each having DRAM memory cells and bit line sense amplifiers BLSA for amplifying data stored in the cells. The DRAM core 680 may have the open bit line architecture.

The row decoder 660 and a column decoder (not illustrated) may locate a memory cell to be accessed in response to a command and address applied from outside. The command may include a row address and a column address for a DRAM operation, and may, for example, include a Row Address Strobe (RAS) signal, a column address strobe (CAS) signal, and a write enable (WE) signal, for example.

The row decoder and mat controller 660 may decode a row address RA<0:n> of the corresponding mat in response to the row address RA<0:n> which is generated through the row address decoder 640 as the RAS signal is enabled, a bank active signal ACT_BK<i> which is generated through the bank address and command decoder 620, and a mat select signal MATSEL<0:k> which is generated through the mat selection unit 650.

The word line decoder 670 may generate a main word line select signal MWLB and a sub word line select signal FXB in response to the decoded row address and mat select signal which are generated through the row decoder and mat controller 660.

In the semiconductor memory device 600 having the above-described configuration, when a word line WLB<i> within any one mat, which is selected by the main word line select signal MWLB and the sub word line select signal FXB, are activated during a read operation, enable signals SAEN<i> and SAEN<i+1> for bit line sense amplifiers arranged at the top and bottom of the corresponding word line WLB<i> and enable signals SAEN<i−1> and SAEN<i+ 2> for bit line sense amplifiers which are the second closest to the word line WLB<i> are enabled for sensing and amplifying data of bit lines which are coupled to the memory cells coupled to the word line WLB<i>.

The configuration and operation for activating not only sense amplifiers for sensing and amplifying bit lines coupled to an activated word line (e.g., sense amplifiers positioned at the top and bottom of the corresponding mat) but also sense amplifiers for sensing and amplifying bit lines which are the second closest to the activated word line will be described in detail with reference to FIG. 6.

Figure 6:
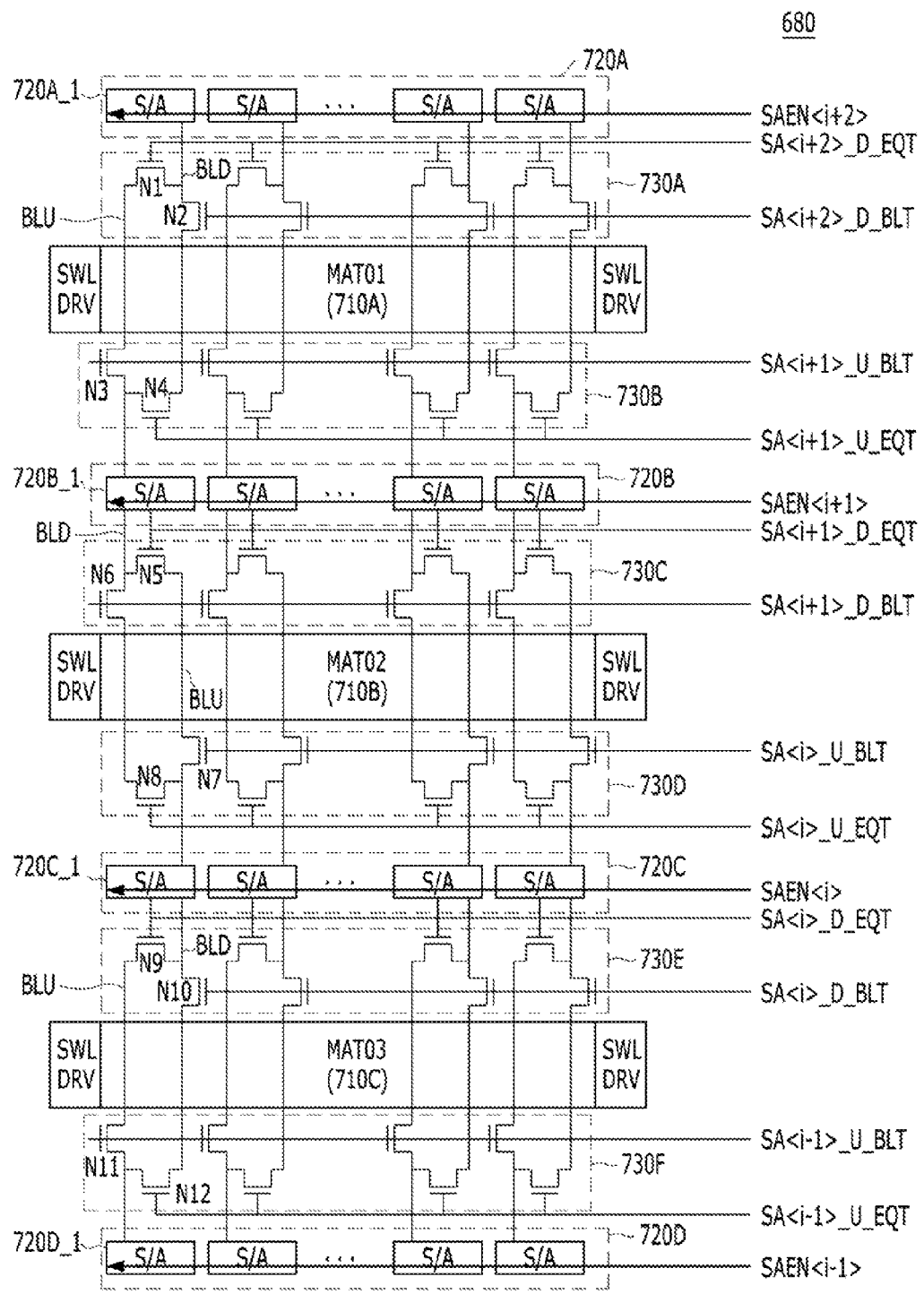
FIG. 6 is a circuit diagram illustrating only a part of the DRAM core of FIG. 5.

FIG. 6 is a circuit diagram illustrating a part of the DRAM core 680 of FIG. 5.

According to the embodiment of FIGS. 5 and 6, the DRAM core 680 may include a plurality of mats 710A to 710C, a plurality of sense amplifier arrays 720A to 720D, sub word line drivers SWL DRV arranged at the left and right sides of each of the mats 710A to 710C, and a plurality of switching units 730A to 730F positioned between the plurality of mats 710A to 710C and the plurality of sense amplifier arrays 720A to 720D, respectively.

The plurality of sense amplifier arrays 720A to 720D are arranged alternately with the plurality of mats 710A to 710C, and sense and amplify a bit line and bit line bar (not illustrated) which are arranged in different mats. With reference to each of the sense amplifier arrays 720A to 720C, a bit line arranged in the upper mat is defined as an upper bit line BLU, and a bit line arranged in the lower mat is defined as a lower bit line BLD.

When a specific word line in any one mat among the plurality of mats 710A to 710C is activated, all memory cells (not illustrated) coupled to the activated word line may be opened, and bit lines BLU/BLD coupled to the memory cells may share data. Then, all sense amplifiers within the sense amplifier arrays arranged at the top and bottom of the corresponding mat may be activated to sense and amplify the data of the bit lines. In addition to the sense amplifier arrays arranged at the top and bottom of the corresponding mat, the sense amplifier arrays which are the second closest to the mat may be activated to sense and amplify the data of the bit lines after a predetermined time.

The plurality of switching units 730A to 730F may electrically couple the bit lines arranged at the top and bottom of the plurality of sense amplifier arrays 720A to 720D. The following descriptions will be focused on the third switching unit 730C among the plurality of switching units 730A to 730F.

The third switching unit 730C may include a first plurality of transistors operable in response to a bit line coupling signal SA<i+1>_D_BLT enabled during a column operation (e.g., the read/write operation) of the corresponding mat or the second mat 720D, and a second plurality of transistors operable in response to a bit line equalizing signal SA<i+ 1>_D_EQT enabled during a precharge operation to the second mat 720D. Since the semiconductor memory device 600 according to an embodiment of the present invention has the open bit line architecture, the switching unit may be arranged between the sense amplifier arrays arranged at the top and bottom of the corresponding mat.

Figure 7:
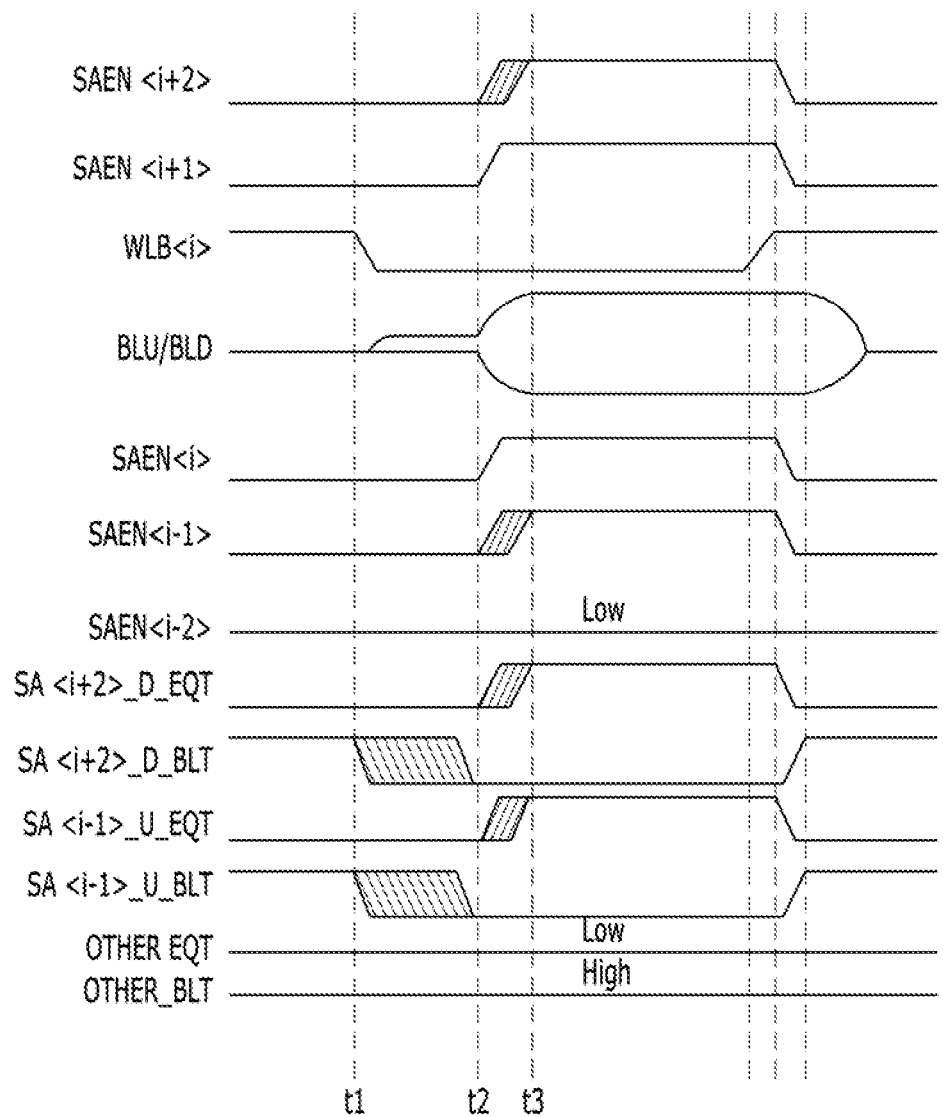
FIG. 7 is a timing diagram illustrating a data sensing operation to the DRAM core of FIG. 6.

Hereafter, a data sensing operation to the DRAM core 680 will be described with reference to FIGS. 6 and 7. FIG. 7 is a timing diagram illustrating a data sensing operation to the DRAM core 680 of FIG. 6. Hereafter, referring to FIGS. 6 and 7, a data sensing operation in case where a specific word line WLB<i> of the second mat 710B among the plurality of mats 710A to 710C is activated will be described. In order to promote understanding, the sense amplifiers 720A_1 to 720D_1 which are positioned at the leftmost sides of the respective sense amplifier arrays 720A to 720D will be taken as an example for description. The sense amplifiers 720A_1 to 720D_1 positioned at the leftmost sides will be referred to as first to fourth sense amplifiers 720A_1 to 720D_1, respectively.

When data of the second mat 710B are sensed, bit lines may be coupled by sixth and seventh NMOS transistors N6 and N7 of the third and fourth switching units 730C and 730D arranged at the top and bottom of the second mat 710B, and the sixth and seventh NMOS transistors N6 and N7 may be turned on in response to an (i+1)th lower bit line coupling signal SA<i+1>_D_BLT and an i-th upper bit line coupling signal SA<i>_U_BLT, respectively. Furthermore, when the data of the second mat 710B are sensed, fifth and eighth NMOS transistors N5 and N8 of the third and fourth switching units 730C and 730D may be turned on to perform an equalizing operation during a precharge operation. Thus, the fifth and eighth NMOS transistors N5 and N8 may be turned off in response to an (i+1)th down equalizing signal SA<i+1>_D_EQT and an i-th up equalizing signal SA<i>_U_EQT, respectively.

Since the second and fifth switching units 730B and 730E are coupled to the second and third sense amplifier arrays 720B and 720C like the third and fourth switching units 730C and 730D, the third NMOS transistor N3 may be turned on in response to an (i+1)th upper bit line coupling signal SA<i+1>_U_BLT, and the tenth NMOS transistor N10 may be turned on in response to an i-th lower bit line coupling signal SA<i>_D_BLT. Furthermore, the fourth NMOS transistor N4 may be turned off in response to an (i+1)th up equalizing signal SA<i+1>_U_EQT, and the tenth NMOS transistor N10 may be turned off in response to an i-th down equalizing signal SA<i>_D_EQT.

Thus, the second and third sense amplifiers 720B and 720C may perform the sense amplification operation for the corresponding bit line in response to the (i+1)th sense amplifier enable signal SAEN<i+1> and the i-th sense amplifier enable signal SAEN<i>, respectively.

For example, when a bit line arranged in the first mat 710A corresponding to the upper mat with reference to the second sense amplifier 720B_1 is referred to as an upper bit line BLU and a bit line arranged in the second mat 710 corresponding to the lower mat is referred to as a lower bit line BLD, the upper bit line BLU may be amplified to a low level L while retaining a precharge voltage VBLP, and the lower bit line BLD may share high-level data information stored in a memory cell (not illustrated) with the upper bit line BLU as the word line WLB<i> is enabled to the low level L. Then, the lower bit line BLD may be sensed and amplified to the precharge voltage VBLP by the second sense amplifier 720B_1, and then amplified to the high level H while retaining the precharge voltage VBLP.

Then, when a bit line arranged in the second mat 710B corresponding to the upper mat with reference to the third sense amplifier 720C_1 is referred to as an upper bit line BLU and a bit line arranged in the second mat 710C corresponding to the lower mat is referred to as a lower bit line BLD, the upper bit line BLU may share high-level data information stored in a memory cell (not illustrated) with the lower bit line BLD, as the word line WLB<i> is activated to the low level L. Then, the upper bit line BLU may be sensed and amplified to the precharge voltage VBLP by the third sense amplifier 720C_1, and then amplified to the high level H while retaining the precharge voltage VBLP. The lower bit line BLD may be amplified to the low level L while retaining the precharge voltage VBLP.

When the second mat 710B is activated, the first and sixth switching units 730A and 730F may operate in the opposite manner of the second to fourth switching units 730B to 730E in order to activate the first and fourth sense amplifier arrays 720A and 720D. More specifically, the first NMOS transistor N1 of the first switching unit 730A, which is turned on during a precharge operation to the first mat 710A, may be turned off and the second NMOS transistor N2, which is a bit line coupling transistor operating during a data sensing operation to the first mat 710A, may be turned on to be coupled to the first sense amplifier 720A_1. However, since the first sense amplifier 720A_1 needs to be activated even during a data sensing operation to the second mat 710B, the (i+2)th down equalizing signal SA<i+2>_D_EQT may be enabled to turn on the first NMOS transistor N1 at a predetermined time after the i-th sense amplifier enable signal SAEN<i> is enabled, and the (i+2)th lower bit line coupling signal SA<i+2>_D_BLT may be disabled to turn off the second NMOS transistor N2.

Thus, the first sense amplifier 720A_1 may perform a data sensing operation to the second mat 710B in response to the (i+2)th sense amplifier enable signal SAEN<i+2>. Since the data sensing operation is performed in the same manner as the operation to the second sense amplifier 720B_1, the detailed descriptions thereof are omitted herein.

The 11th NMOS transistor N11 of the sixth switching unit 730F, which is a bit line coupling transistor operating during a data sensing operation to the third mat 710C, may be turned on to be coupled to the fourth sense amplifier 720D_1, and the 12th NMOS transistor N12, which is turned on during a precharge operation to the third mat 710C, may be turned off. However, since the fourth sense amplifier 720D_1 needs to be activated even during a data sensing operation to the second mat 710B, the (i−1)th up equalizing signal SAEN<i−1>_U_EQT may be enabled to turn on the 12th NMOS transistor N12 at a predetermined time after the i-th sense amplifier enable signal SAEN<i> and the (i+1)th sense amplifier enable signal SAEN<i+1> are enabled, and the (i−1)th upper bit line coupling signal SA<i−1>_UP_BLT may be enabled to turn off the 11th NMOS transistor N11.

Thus, the second sense amplifier 720D_1 may perform a data sensing operation to the second mat 710B in response to the (i−1)th sense amplifier enable signal SAEN<i−1>. Since the data sensing operation is performed in the same manner as the operation to the third sense amplifier 720C_1, the detailed descriptions thereof are omitted herein.

In short, the semiconductor memory device according to an embodiment of the present invention may have the open bit line architecture, and control the activation operation to the sense amplifiers, which are the second closest to a specific mat, as well as the sense amplifiers arranged at the top and bottom of the corresponding mat when the mat is enabled. Thus, the semiconductor memory device can additionally amplify data during a data sensing operation, thereby securing a data sensing margin and a stable precharge state.

Figure 8:
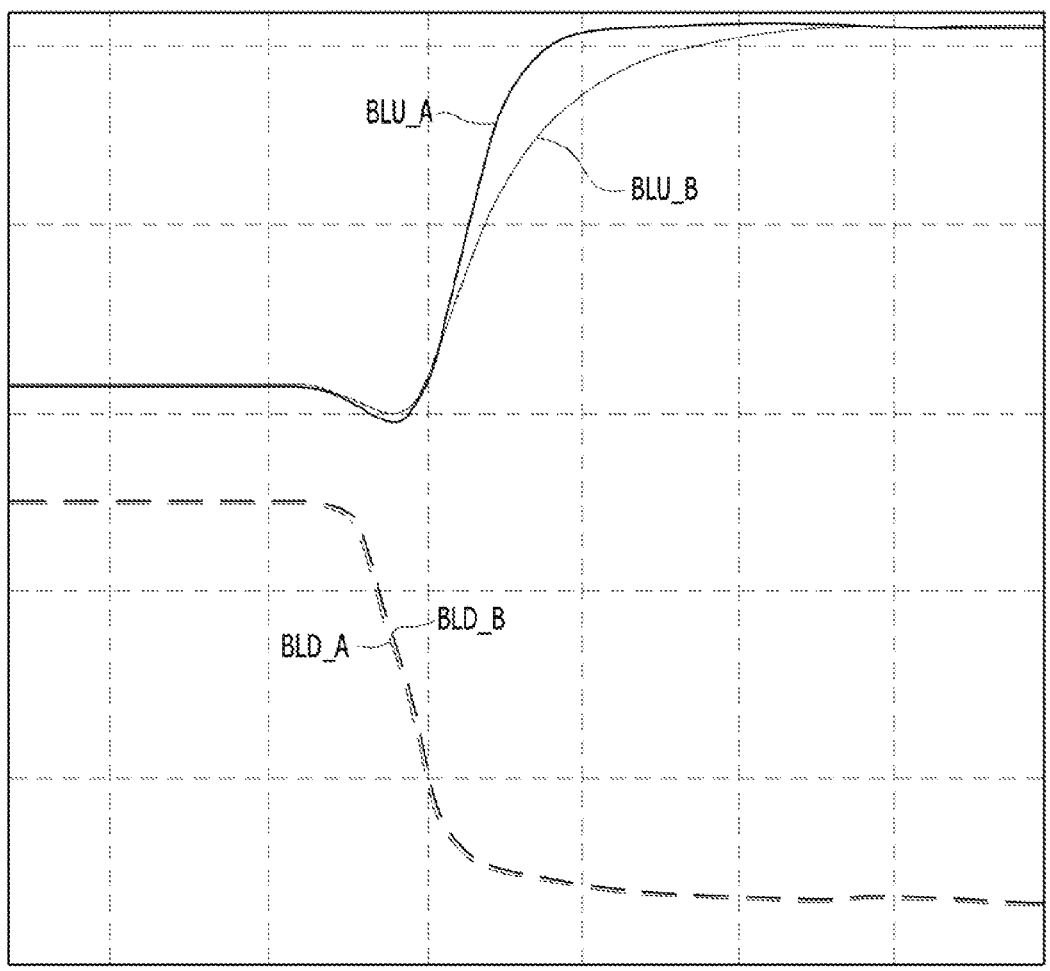
FIG. 8 is a timing diagram comparatively illustrating sensing characteristics of the conventional semiconductor memory device and the semiconductor memory device according to the embodiment of the present invention.

FIG. 8 is a timing diagram comparatively illustrating the sensing characteristics of the conventional semiconductor memory device and the semiconductor memory device according to an embodiment of the present invention.

FIG. 8 illustrates that, during a data sensing operation, the upper bit line BLU_A of the semiconductor memory device according to an embodiment of the present invention is amplified more than the upper bit line BLU_B of the conventional semiconductor memory device. This is because, during a data sensing operation to a specific mat, the sense amplifiers which are the second closest to the corresponding mat as well as the sense amplifiers arranged at the top and bottom of the mat can be controlled to be activated, in order to additionally amplify data.

In FIG. 8, an additional amplifying operation for the lower bit lines BLD_A and BLD_B is not performed. However, when an additional amplifying operation for the lower bit lines BLD_A and BLD_B are performed, it is possible to obtain the same effect as the upper bit line.

According to embodiments of the present invention, a semiconductor memory device is provided capable of improving a sensing margin during a data sensing operation, additionally amplifying data, and securing a stable precharge state.

Although various embodiments have been described for illustrative purposes, it will be apparent to those skilled in the art that various changes and modifications may be made without departing from the spirit and/or scope of the invention as defined in the following claims.

What is claimed is:

1. A semiconductor memory device comprising:
    a plurality of memory mats; and
    a plurality of sense amplifier arrays arranged alternately with the memory mats, each sense amplifier array being suitable for sensing and amplifying data of memory mats adjacent thereto,
    wherein during a data sensing operation to a memory mat among the plurality of memory mats, in addition to a sense amplifier for the memory mat and sense amplifiers positioned immediately above and below the sense amplifier for the memory mat, at least one additional sense amplifier closest to the sense amplifier for the memory mat is also activated for providing additional amplification.

2. The semiconductor memory device of claim 1, wherein each of the memory mats is a memory block.

3. The semiconductor memory device of claim 2,
    wherein the sensing operation is to a Kth memory block among the plurality of memory blocks, and a Kth sense amplifier array, a (K+1)th sense amplifier array, a (K−1)th sense amplifier array, and a (K+2)th sense amplifier array are activated.

4. The semiconductor memory device of claim 3, further comprising:
    a first switching unit suitable for electrically coupling a bit line of a (K+1)th memory block to a bit line of the Kth memory block during the data sensing operation to the Kth memory block; and
    a second switching unit suitable for electrically coupling a bit line of a (K−1)th memory block to the bit line of the Kth memory block during the data sensing operation to the Kth memory block.

5. The semiconductor memory device of claim 4,
    wherein the first switching unit comprises:
    a plurality of bit line coupling transistors suitable for electrically coupling the (K+2)th sense amplifier array to the bit line of the (K+1)th memory block during a data sensing operation to the (K+1)th memory block; and
    a plurality of equalizing transistors suitable for equalizing the bit line during a precharge operation to the (K+1)th memory block, and
    wherein the plurality of equalizing transistors are turned on to electrically couple the bit line of the (K+1)th memory block to the bit line of the Kth memory block during the data sensing operation to the Kth memory block.

6. The semiconductor memory device of claim 5, wherein the plurality of bit line coupling transistors are turned off during the data sensing operation to the Kth memory block.

7. The semiconductor memory device of claim 4,
    wherein the second switching unit comprises:
    a plurality of bit line coupling transistors suitable for electrically coupling the (K−1)th sense amplifier array to the bit line of the (K−1)th memory block during a data sensing operation to the (K−1)th memory block; and
    a plurality of equalizing transistors suitable for equalizing the bit line during a precharge operation to the (K−1)th memory block, and
    wherein the plurality of equalizing transistors are turned on to electrically couple the bit line of the (K−1)th memory block to the bit line of the Kth memory block, during the data sensing operation to the Kth memory block.

8. The semiconductor memory device of claim 7, wherein the plurality of bit line coupling transistors are turned off during the data sensing operation to the Kth memory block.

9. The semiconductor memory device of claim 3, wherein during the data sensing operation to the Kth memory block, the (K+2) sense amplifier array and the (K−1)th sense amplifier array are activated at a predetermined time after the (K+1)th sense amplifier array and the Kth sense amplifier array are activated.

10. The semiconductor memory device of claim 4, further comprising:
    a third switching unit suitable for electrically coupling the bit line of the (K+1)th memory block to the (K+1)th sense amplifier array during the data sensing operation to the Kth memory block;
    a fourth switching unit suitable for electrically coupling the bit line of the Kth memory block to the (K+1)th sense amplifier array during the data sensing operation to the Kth memory block;
    a fifth switching unit suitable for electrically coupling the bit line of the Kth memory block to the (K−1)th sense amplifier array during the data sensing operation to the Kth memory block; and
    a sixth switching unit suitable for electrically coupling the bit line of the (K−1)th memory block to the (K−1)th sense amplifier array during the data sensing operation to the Kth memory block.

11. The semiconductor memory device of claim 10, wherein each of the third to sixth switching units comprises:
    a plurality of bit line coupling transistors suitable for electrically coupling a bit line arranged in a memory block adjacent to the switching unit to a sense amplifier array adjacent to the switching unit during a data sensing operation to the memory block adjacent to the switching unit; and
    a plurality of equalizing transistors suitable for equalizing the bit line arranged in the memory block adjacent to the switching unit during a precharge operation to the memory block adjacent to the switching unit.

12. A semiconductor memory device comprising:
    first to third memory blocks;
    a first sense amplifier coupled to a first bit line of the first memory block;
    a second sense amplifier coupled to a second bit line of the first memory block and a third bit line of the second memory block;
    a third sense amplifier coupled to a fourth bit line of the second memory block and a fifth bit line of the third memory block; and a fourth sense amplifier coupled to a sixth bit line of the third memory block, wherein, during a data sensing operation to the second memory block, the first and fourth sense amplifiers are activated at a predetermined time after the second and third sense amplifiers are activated.

13. The semiconductor memory device of claim 12, further comprising:
- a first switching unit suitable for electrically coupling the second bit line to the first sense amplifier during the data sensing operation to the second memory block; and
- a second switching unit suitable for electrically coupling the fifth bit line to the fourth sense amplifier during the data sensing operation to the second memory block.

14. The semiconductor memory device of claim 13,
wherein the first switching unit comprises:
- a plurality of bit line coupling transistors suitable for electrically coupling the first sense amplifier to the first bit line during a data sensing operation to the first memory block; and
- a plurality of equalizing transistors suitable for equalizing the first bit line during a precharge operation to the first memory block, and wherein the plurality of equalizing transistors are turned on to electrically couple the first bit line to the second bit line during the data sensing operation to the second memory block.

15. The semiconductor memory device of claim 14, wherein the plurality of bit line coupling transistors are turned off during the data sensing operation to the second memory block.

16. The semiconductor memory device of claim 13,
wherein the second switching unit comprises:
- a plurality of bit line coupling transistors suitable for electrically coupling the fourth sense amplifier to the sixth bit line during a data sensing operation to the third memory block; and
- a plurality of equalizing transistors suitable for equalizing the sixth bit line during a precharge operation to the third memory block, and wherein the plurality of equalizing transistors are turned on to electrically couple the fifth bit line to the sixth bit line during the data sensing operation to the second memory block.

17. The semiconductor memory device of claim 16, wherein the plurality of bit line coupling transistors are turned off during the data sensing operation to the second memory block.

\* \* \* \* \*